(12) United States Patent
Chen et al.

(10) Patent No.: US 9,209,190 B2
(45) Date of Patent: Dec. 8, 2015

(54) DEEP TRENCH CAPACITOR

(71) Applicant: Taiwan Semiconductor Manufacturing Co., Ltd., Hsin-Chu (TW)

(72) Inventors: Chih-Ming Chen, Hsinchu (TW);
Szu-Yu Wang, Hsinchu (TW);
Chung-Yi Yu, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/925,984

(22) Filed: Jun. 25, 2013

(65) Prior Publication Data
US 2014/0374880 A1  Dec. 25, 2014

(51) Int. Cl.
*H01L 27/108* (2006.01)
*H01L 49/02* (2006.01)
*H01L 27/08* (2006.01)

(52) U.S. Cl.
CPC .......... *H01L 27/10829* (2013.01); *H01L 28/40* (2013.01); *H01L 27/0805* (2013.01); *H01L 28/91* (2013.01)

(58) Field of Classification Search
USPC ....................................................... 257/532
See application file for complete search history.

(56) References Cited

U.S. PATENT DOCUMENTS

| 8,085,524 | B2 * | 12/2011 | Roozeboom et al. ...... 361/306.2 |
| 2007/0158714 | A1 | 7/2007 | Eshun et al. |
| 2008/0291601 | A1 | 11/2008 | Roozeboom et al. |
| 2010/0117612 | A1 * | 5/2010 | Klootwijk et al. ............ 323/282 |
| 2012/0211865 | A1 * | 8/2012 | Tian et al. ..................... 257/532 |

* cited by examiner

*Primary Examiner* — Eduardo A Rodela
*Assistant Examiner* — Vincent Wall
(74) *Attorney, Agent, or Firm* — Eschweiler & Associates, LLC

(57) ABSTRACT

The present disclosure relates to a method of forming a capacitor structure, including depositing a plurality of first polysilicon (POLY) layers of uniform thickness separated by a plurality of oxide/nitride/oxide (ONO) layers over a bottom and sidewalls of a recess and substrate surface. A second POLY layer is deposited over the plurality of first POLY layers, is separated by an ONO layer, and fills a remainder of the recess. Portions of the second POLY layer and the second ONO layer are removed with a first chemical-mechanical polish (CMP). A portion of each of the plurality of first POLY layers and the first ONO layers on the surface which are not within a doped region of the capacitor structure are removed with a first pattern and etch process such that a top surface of each of the plurality of first POLY layers is exposed for contact formation.

20 Claims, 6 Drawing Sheets

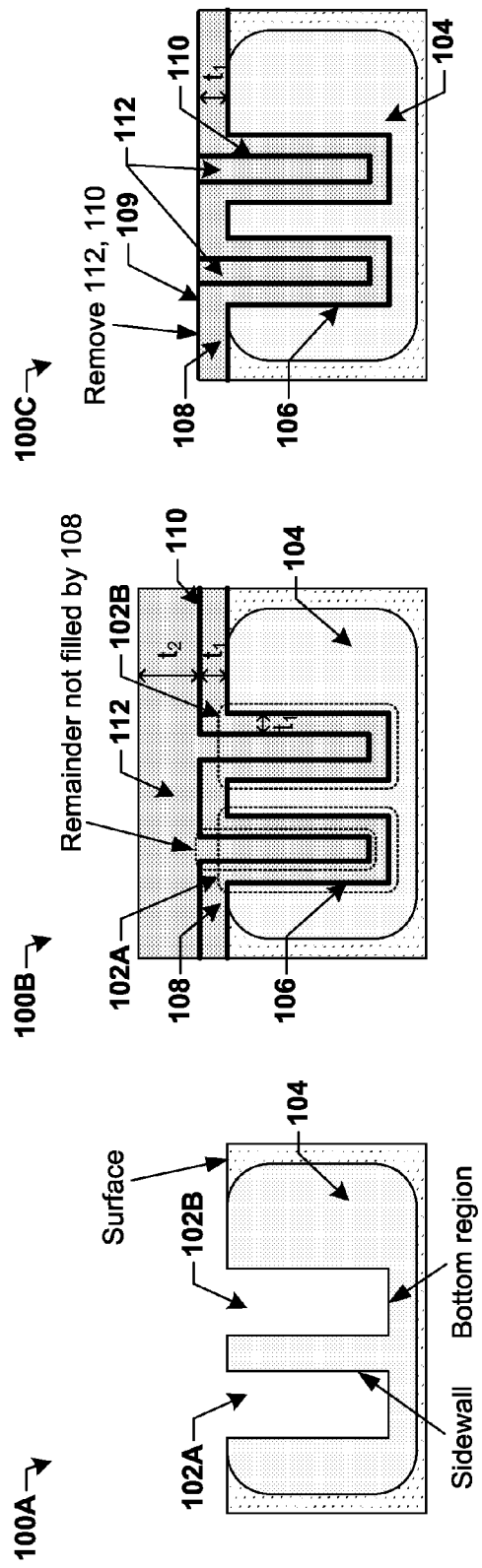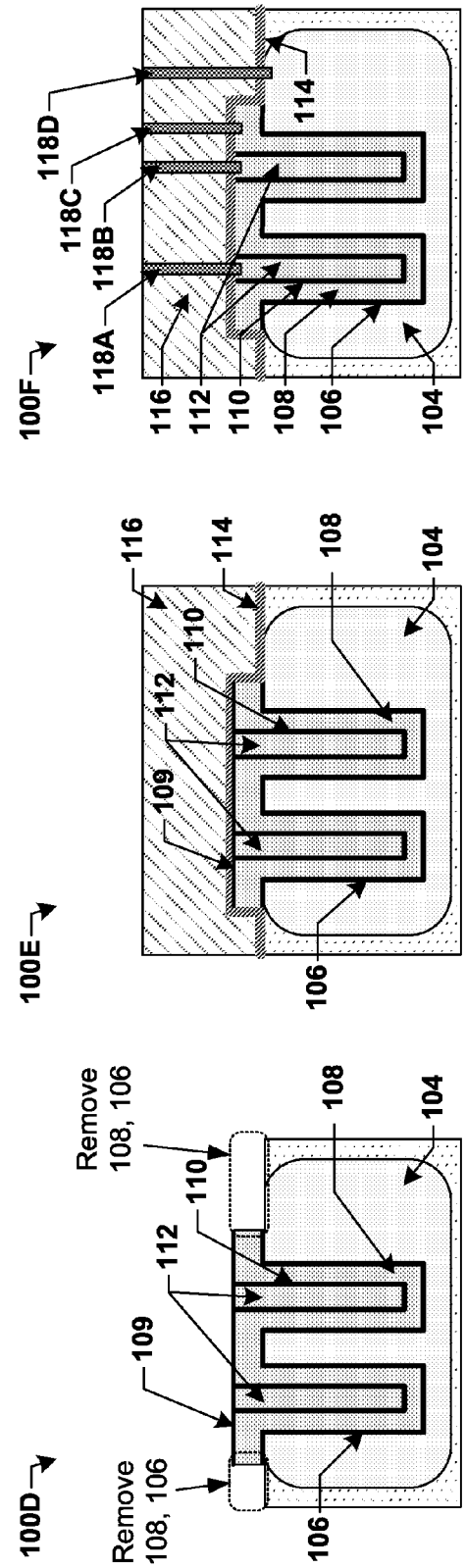

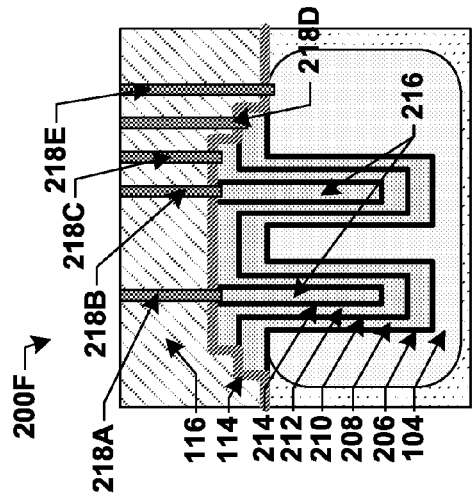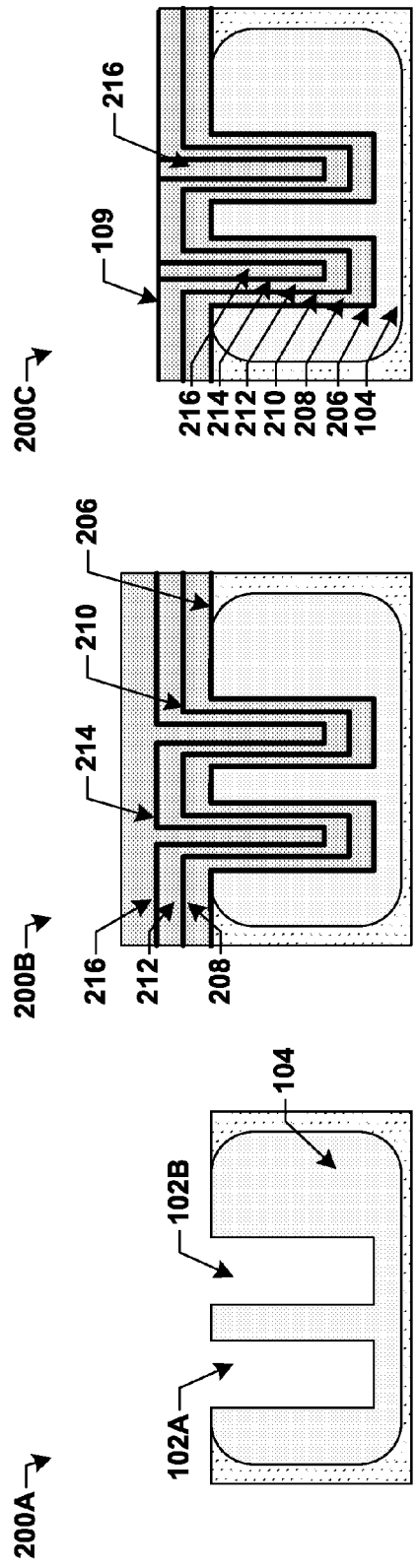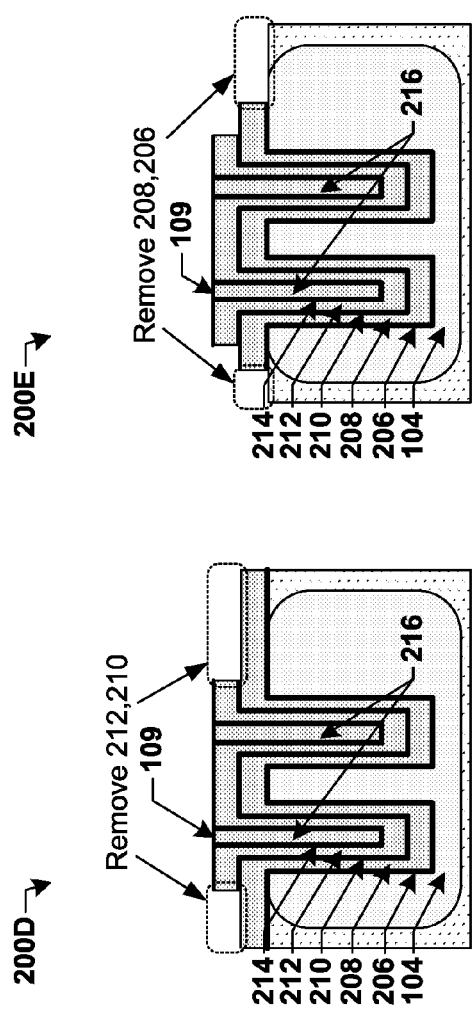

DEEP TRENCH CAPACITOR

BACKGROUND

A Deep Trench Capacitor (DTC) exhibits high power density relative to some other capacitor types within a semiconductor integrated circuit (IC). As such, DTCs are utilized in applications such as dynamic random-access memory (DRAM) storage cells, among others. Some examples of DTCs include multiple-polysilicon (multi-POLY) DTCs which are utilized in advanced technology node processes in place of discrete capacitors.

BRIEF DESCRIPTION OF THE DRAWINGS

FIGS. 1A-1F illustrate some embodiments of double-POLY DTC formation.

FIGS. 2A-2F illustrate some embodiments of triple-POLY DTC formation.

DETAILED DESCRIPTION

Figure 3:
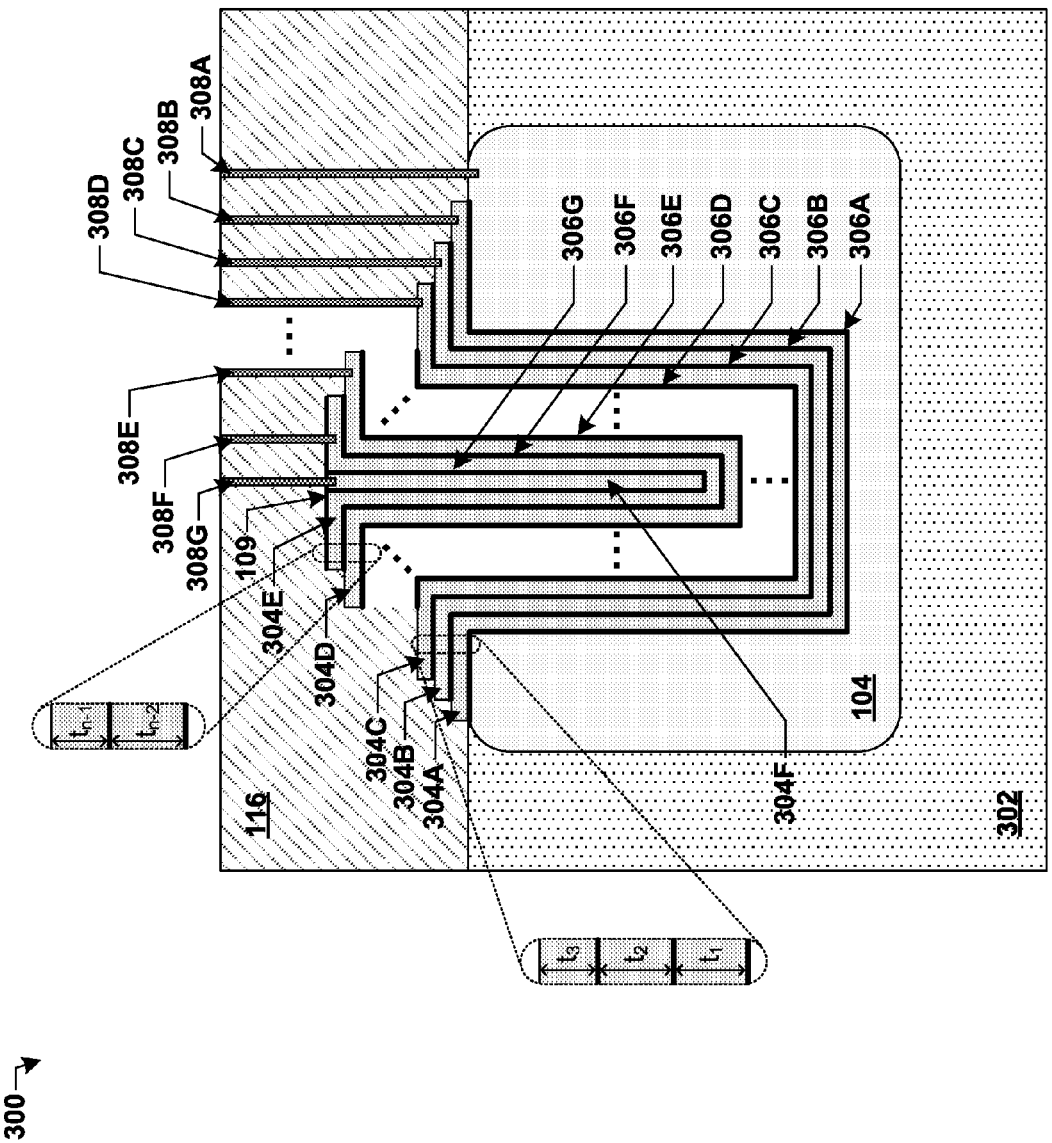
FIG. 3 illustrates some embodiments of a multi-POLY DTC structure.

The present disclosure will now be described with reference to the drawings wherein like reference numerals are used to refer to like elements throughout, and wherein the illustrated structures are not necessarily drawn to scale. It will be appreciated that this detailed description and the corresponding figures do not limit the scope of the present disclosure in any way, and that the detailed description and figures merely provide a few examples to illustrate some ways in which the inventive concepts can manifest themselves.

It is also noted that the present disclosure presents embodiments in the form of multi-POLY DTC structures, and may be included in an IC such as a microprocessor, memory device, and/or other IC. The IC may also include various passive and active microelectronic devices, such as resistors, other capacitor types (e.g., MIMCAP), inductors, diodes, metal-oxide-semiconductor field effect transistors (MOSFETs), complementary MOS (CMOS) transistors, bipolar junction transistors (BJTs), laterally diffused MOS (LDMOS) transistors, high power MOS transistors, or other types of transistors. One of ordinary skill may recognize other embodiments of semiconductor devices that may benefit from aspects of the present disclosure.

Some prior art methods of forming a multi-POLY DTC require a dedicated photomask exposure and etch step for each layer of polysilicon (POLY), followed by deposition on an inter-layer dielectric (ILD) layer configured to isolate individual contacts formed to each POLY layer, and a chemical-mechanical polish (CMP) for planarization of the ILD layer prior to contact etch. A step height between two POLY layers of the multi-POLY DTC after a dedicated photomask exposure and etch step for one of the POLY layers introduces topographical variation which can cause poor CMP uniformity.

Accordingly, some embodiments of the present disclosure relate to a method of forming a capacitor structure. The method includes depositing a plurality of first POLY layers of uniform thickness over a bottom region and sidewalls of a recess formed within a substrate and over a surface of the substrate. The plurality of first POLY layers are separated from one another and the substrate by a plurality of first dielectric layers. The method further includes depositing a second POLY layer over the plurality of first POLY layers. The second POLY layer fills a remainder of the recess not filled by the plurality of first POLY layers, and the second POLY layer is separated from the first POLY layer by a second dielectric layer. Portions of the second POLY layer and the second dielectric layer not within the recess are removed with a CMP, etch back, or a combination of the two. And, a portion of each of the plurality of first POLY layers and the first dielectric layers on the surface which are not within a doped region in a vicinity of the recess are removed with a first pattern and etch process such that a top surface of each of the plurality of first POLY layers is exposed for contact formation.

By utilizing a CMP process to remove the portions of the second POLY layer, mask usage is reduced over the aforementioned prior art methods. This concept can be applied to any number of POLY layers within a multi-POLY capacitor structure such as a DTC for a DRAM storage cell. This method can also be show to achieve comparable electric performance the aforementioned prior art methods, and reduces an overall step height and hence CMP loading after ILD deposition.

FIGS. 1A-1F illustrate some embodiments of double-POLY DTC formation. FIG. 1A illustrates a substrate 100A, wherein first and second recesses 102A, 102B are formed within a doped region 104 of the substrate 100A. For DTC applications such as volatile DRAM, a plurality of recesses are patterned in an array, where each recess contains an identical structure after DTC formation.

For the embodiments of FIGS. 1A-1F, the substrate 100A is a p-type silicon substrate. Other substrate types may comprise an n-type silicon substrate, or another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In an embodiment, the substrate 100A is a semiconductor on insulator (SOI).

For the embodiments of FIGS. 1A-1F, the doped region 104 of the substrate 100A is formed through an ion implantation technique of an n-type dopant, in which ionized phosphors, arsenic, or antimony are accelerated in an electrical field and impacted on the surface of the substrate 100A. After the dopant ions are implanted, a first thermal anneal is performed to drive-in and to activate the dopants, in accordance with some embodiments. The first thermal anneal may utilize rapid thermal processing (RTP) anneal, spike anneal, millisecond anneal, or laser anneal. Spike anneal operates at peak anneal temperature in the order of second. Millisecond anneal operates at peak anneal temperature in the order of milliseconds and laser anneal operates at peak anneal temperature in the order of micro seconds.

One or more etching processes may be used to form the first and second recesses 102A, 102B, including dry etching process(es) such as a plasma etching, wet etching process(es), or a combination thereof. In some embodiments, the dry plasma etch comprises a bombarding the substrate with ions (e.g., fluorocarbons, oxygen, chlorine, nitrogen, argon, helium, etc.) that dislodge portions of the material from the substrate 100A. Wet etching may also be utilized to achieve an isotropic etch profile in some embodiments. For example, an etchant such as carbon tetrafluoride ($CF_4$), HF, tetramethylammonium hydroxide (TMAH), or combinations of thereof, or the like may be used to perform the wet etch and form the first and second recesses 102A, 102B in some embodiments.

FIG. 1B illustrates a substrate 100B comprising the substrate 100A, wherein a first dielectric layer 106 is deposited over a bottom region and sidewalls of the first and second recesses 102A, 102B. In some embodiments, the first dielectric layer 106 comprises oxide/nitride/oxide (ONO) composite layer, and deposition of the first dielectric layer 106 is achieved through chemical vapor deposition (CVD). Some derivative CVD processes further comprise low pressure CVD (LPCVD), atomic layer CVD (ALCVD), ultrahigh vacuum CVD (UHVCVD), reduced pressure CVD (RPCVD), or any combinations thereof. Molecular beam epitaxy (MBE) or metalorganic vapor phase epitaxy (MOVPE) may also be utilized for epitaxial growth.

A first conducting layer 108 is deposited over the first dielectric layer 106, and has a substantially uniform first thickness ($t_1$). In some embodiments, the first conducting layer 106 comprises polysilicon layer (POLY), and deposition is achieved by pyrolyzing silane ($SiH_4$) inside a low-pressure reactor at a temperature in a range of approximately 500° C. to approximately 700° C. to release Si which accumulates on the surface of the substrate 100A, and along the bottom regions and sidewalls of the first and second recesses 102A, 102B.

A second dielectric layer 110 is deposited over the first conducting layer 108, and a second conducting layer 112 is deposited over the second dielectric layer 110. In some embodiments, the second dielectric layer 110 comprises oxide/nitride/oxide (ONO) composite layer, and deposition of the second dielectric layer 110 is achieved through chemical vapor deposition (CVD). The second conducting layer 112 fills remainders of the first and second recesses 102A, 102B not filled by the first conducting layer 108. The second conducting layer 112 has a second thickness ($t_2$) that is substantially uniform across the surface of the substrate 100B. In some embodiments, the second conducting layer 112 comprises polysilicon layer (POLY), FIG. 1C illustrates a substrate 100C comprising the substrate 100B, wherein portions of the second conducting layer 112 and the second dielectric layer 110 not within the first or second recess 102A, 102B have been removed through a first planarization process, such as CMP process. The planarized first conducting layer 108 and the planarized second conducting layer 112 have a substantially planar surface 109. In the first CMP process chemical and mechanical forces are exhibited on the substrate 100C by a rotating platen covered by a polishing pad, which in conjunction with a slurry polishes and globally planarizes the substrate 100C. The slurry may include hydrogen peroxide or other suitable material.

FIG. 1D illustrates a substrate 100D comprising the substrate 100C, wherein portions of the first conducting layer 108 and the first dielectric layer 106 have been removed by a pattern and etch process on the surface, wherein the substrate 100D is coated with a layer of photoresist in a spin-on tool, aligned with a mask containing a pattern, and exposed to light which transfers the pattern into the photoresist. In some embodiments, the pattern and etch process uses a positive tone photoresist such that exposed areas of the photoresist layer become soluble upon being exposed, and are subsequently removed. In some embodiments, the pattern and etch process uses a negative tone photoresist such that exposed areas of the photoresist layer become insoluble to a photoresist developer upon being exposed. The photoresist developer is used to dissolve the soluble portion of the photoresist, and the exposed or unexposed features on the semiconductor substrate may then be removed, depending upon the tone of the photoresist.

FIG. 1E illustrates a substrate 100E comprising the substrate 100D, a oxide layer 114 is disposed on a surface of the substrate 100E through an oxidation step. An Inter-Layer Dielectric (ILD) layer 116 of a third thickness ($t_3$) such as tetraethylorthosilicate (TEOS) or flourine or carbon-doped $SiO_2$ is disposed over the poly oxide layer 114 by a derivative CVD processes or other appropriate method. The ILD layer 116 is configured to electrically separate contacts formed in a subsequent patterning step, and has a dielectric constant lower than an approximate k=3.9 value of undoped $SiO_2$, and as close to 1 as possible to minimize capacitive coupling between adjacent metal and contacts.

After planarization of the ILD layer 116 through a second CMP process, trenches are etched and filled with a conductive material (e.g., copper, tungsten, etc.) to form first contact ad second contacts 118A, 118B to the second conducting layer 112, a third contact to the first conducting layer 108, and a fourth contact to the doped region 104 to complete the double-POLY DTC structure 100F of FIG. 1F.

For the embodiments of FIGS. 1A-1F, a combined first thickness ($t_1$) of the first conducting layer 108 and a third thickness of the first dielectric layer 106 is in a range between approximately 1,000 angstroms to approximately 3,000 angstroms, a combined second thickness ($t_2$) of the second conducting layer 112 and a fourth thickness of the second dielectric layer 110 is in a range between approximately 9,000 angstroms to approximately 11,000 angstroms, and the third thickness ($t_3$) after the second CMP process in a range between approximately 8,000 angstroms to approximately 10,000 angstroms. A resulting step height after the pattern and etch process of FIG. 1D which is in a range between approximately 1,000 angstroms to approximately 3,000 angstroms reduces CMP loading and increases CMP uniformity over some prior art approaches.

FIGS. 2A-2F illustrate some embodiments of triple-POLY DTC formation. The embodiments of FIGS. 2A-2F and analogous to the embodiments of FIGS. 1A-1F, but comprise an additional conducting layer for increased capacitance. In general, an arbitrary number of conducting layers may be used. The embodiments of FIG. 2A are identical to those of FIG. 1A.

FIG. 2B illustrates a substrate 200B comprising the substrate 200A, wherein a first POLY layer 208 of substantially uniform thickness is deposited over a bottom region and sidewalls of the first and second recesses 102A, 102B, and separated from the substrate 200A by a first ONO layer 206. A second POLY layer 212 of substantially uniform thickness is deposited over the first POLY layer 208, and separated from the first POLY layer 208 by a second ONO layer 210. A third POLY layer 216 is then deposited over the second POLY layer 212, is separated from the second POLY layer 212 by a third ONO layer 214, and has a substantially uniform thickness across the surface of the substrate 200B.

FIG. 2C illustrates a substrate 200C comprising the substrate 200B, wherein portions of the third POLY layer 216 and the third ONO layer 214 not within the first or second recess 102A, 102B have been removed through a first CMP process. In some embodiments, an etch back of the third POLY layer 216 and the third ONO layer 214 is utilized in the first CMP process.

FIG. 2D illustrates a substrate 200D comprising the substrate 200C, wherein portions of the second POLY layer 212 and second ONO layer 210 have been removed by a first pattern and etch process on the surface, exposing a top surface of the second POLY layer 212 for contact formation.

FIG. 2E illustrates a substrate 200E comprising the substrate 200D, wherein portions of the first POLY layer 208 and first ONO layer 206 have been removed by a second pattern and etch process on the surface, exposing a top surface of the doped region 104 for contact formation.

FIG. 2F illustrates a triple-POLY DTC structure 200F comprising the substrate 200E, wherein a poly oxide layer 114 is disposed on a surface of the substrate 200E, and an ILD layer 116 is disposed above the poly oxide layer 114. After planarization of the ILD layer 116 through a second CMP process, trenches are etched and filled with a conductive material to form first through fifth contacts 218A-218E.

In general, a multi-POLY DTC structure consisting of n poly layers maybe assembled in a same manner as the double-POLY and triple-POLY DTC structures 100F, 200F. FIG. 3 illustrates some embodiments of a multi-POLY DTC structure 300 disposed within a doped region 104 (e.g., doped with phosphors, arsenic, or antimony) of a substrate 302. The multi-POLY DTC structure 300 comprises a first conducting layer 304A (e.g., polysilicon) of a first substantially uniform thickness ($t_1$) disposed over a bottom region and sidewalls of a recess formed within the doped region 102 of the substrate 302 and over a surface of the substrate 302. The first conducting layer 304A is insulated from the substrate 302 by a first dielectric layer 306A (e.g., oxide/nitride/oxide). A second conducting layer 304B of a second substantially uniform thickness ($t_2$) is disposed over the first conducting layer 304A, and separated from the first conducting layer 304A by a second dielectric layer 306B. A third conducting layer 304C of a third substantially uniform thickness ($t_3$) is disposed over the second conducting layer 304B, and separated from the second conducting layer 304B by a third dielectric layer 306C. This type of structure may be repeated until an $(n-1)^{th}$ conducting layer 304E of an $(n-1)^{th}$ substantially uniform thickness ($t_{n-1}$) is disposed over a $(n-2)^{th}$ conducting layer 304E of an $(n-2)^{th}$ substantially uniform thickness ($t_{n-2}$), and separated from the $(n-2)^{th}$ conducting layer 304D by an $(n-2)^{th}$ dielectric layer 306F.

An $n^{th}$ conducting layer 304F is disposed over the $(n-1)^{th}$ conducting layer 304E and insulated from the $(n-1)^{th}$ conducting layer 304E by an $n^{th}$ dielectric layer 306G. The $n^{th}$ conducting layer 304F fills a remainder of the recess not filled by the first through $(n-1)^{th}$ conducting layers 304A-304E, and extends above the substrate 302 by an amount greater than an approximate sum of the first through $n^{th}$ thicknesses.

A top surface of each of the first through $n^{th}$ conducting layers 304A-304F are exposed by multiple pattern and etch processes (i.e., n-1 pattern and etch processes) over the doped region 104, such that contacts may be formed to the doped region 104 and the first through $n^{th}$ conducting layers 304A-304F. A first contact 308A (e.g., copper, tungsten, etc.) connects to the doped region 104. A second contact 308B connects to the exposed top surface of the first conducting layer 304A, a third contact 308C connects to the exposed top surface of the second conducting layer 304B, a fourth contact 308D connects to the exposed top surface of the third conducting layer 304C, an $(n-1)^{th}$ contact 308E connects to the exposed top surface of the $(n-2)^{th}$ conducting layer 304D, an $n^{th}$ contact 308F connects to the exposed top surface of the $(n-1)^{th}$ conducting layer 304E, and a $(n+1)^{th}$ contact 308G connects to the $n^{th}$ conducting layer 304F. A CMP process of the $n^{th}$ conducting layer 304F for formation of the $n^{th}$ contact 308F and $(n+1)^{th}$ contact 308G saves at least one mask over some prior art approaches.

Figure 4A:
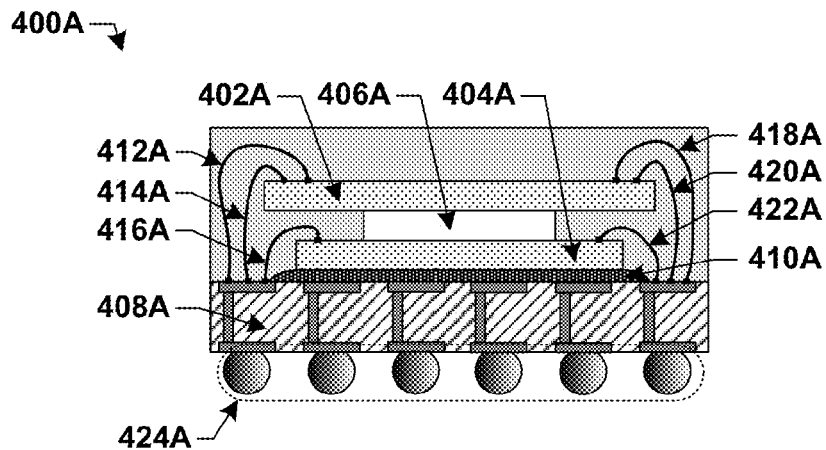
FIGS. 4A-4C illustrate some embodiments of electronically coupling an IC containing a DTC structure to an integrated circuit by a wire bond, a through silicon via, or a bond pad.

The double-POLY, triple-POLY DTC, and multi-POLY DTC structures 100F, 200F, and 300 in general may be utilized in many IC applications. FIG. 4A illustrates a first 3D IC structure 400A comprising a high-voltage (HV) or power IC 402A bonded to a capacitor IC 404A comprising one of more DTC structures by an epoxy 406A, wherein the HV or power IC 402A and the capacitor IC 404A are stacked vertically above a substrate 408A and separated from the substrate 408A by an underfill layer 410A. In some embodiments, the underfill layer 410A may comprise one or more of polyimide, polyetherimide, benzocyclobutene (BCB), bismaleimide-triazine (BT), epoxy, or silicone. A plurality of wirebond (WB) structures 412A-422A electrically couple the HV or power IC 402A bonded to the capacitor IC 404A as well as to the substrate 408A which is coupled to a plurality of solder balls 424A to form the 3D IC structure 400A.

Figure 4B:
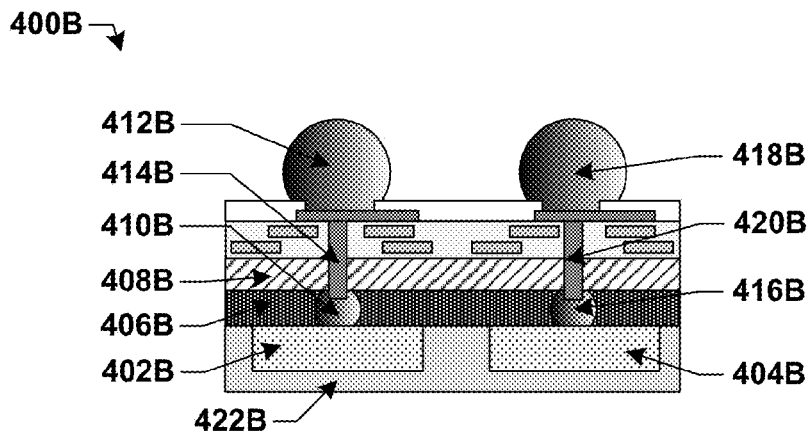

FIG. 4B illustrates a second 3D IC structure 400B, wherein an HV or power IC 402B and a capacitor IC 404B comprising one of more DTC structures reside within a same package 422B, which is bonded to a substrate 408B by an epoxy 406B. A first mini solder ball 410B couples the HV or power IC 402B to a first large solder ball 412B through a first through-silicon via (TSV) 414B. Likewise, a second mini solder ball 416B couples the capacitor IC 404A to a second large solder ball 418B through a second TSV 420B. In some embodiments, the first large solder ball 412B and the second large solder ball 418B comprise a flip-chip ball grid arrays (FCBGAs) for 2.5D and 3D applications.

Figure 4C:
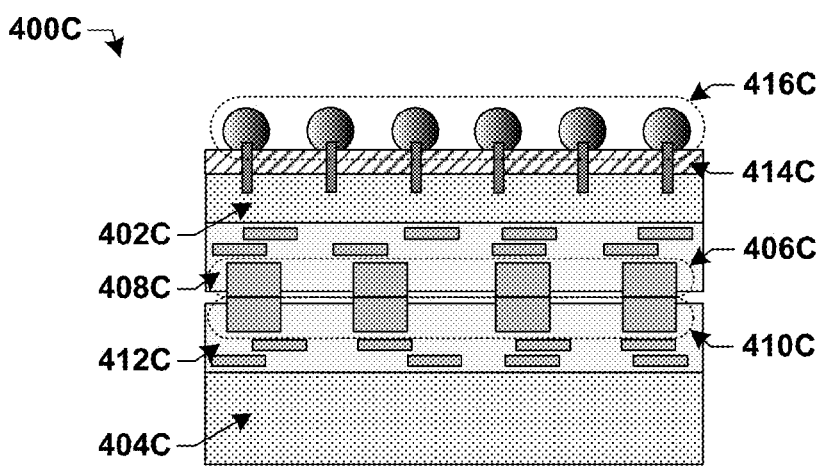

FIG. 4C illustrates a third 3D IC structure 400C, wherein an HV or power IC 402C is coupled to a capacitor IC 404C comprising one of more DTC structures by a plurality of first and second bond pads, 406C and 410C respectively, which reside within first and second packages, 408C and 412C respectively. The HV or power IC 402C is electrically coupled to a plurality of solder balls 416C comprising a FCBGA for 2.5D and 3D applications through a substrate 414C.

Figure 5:
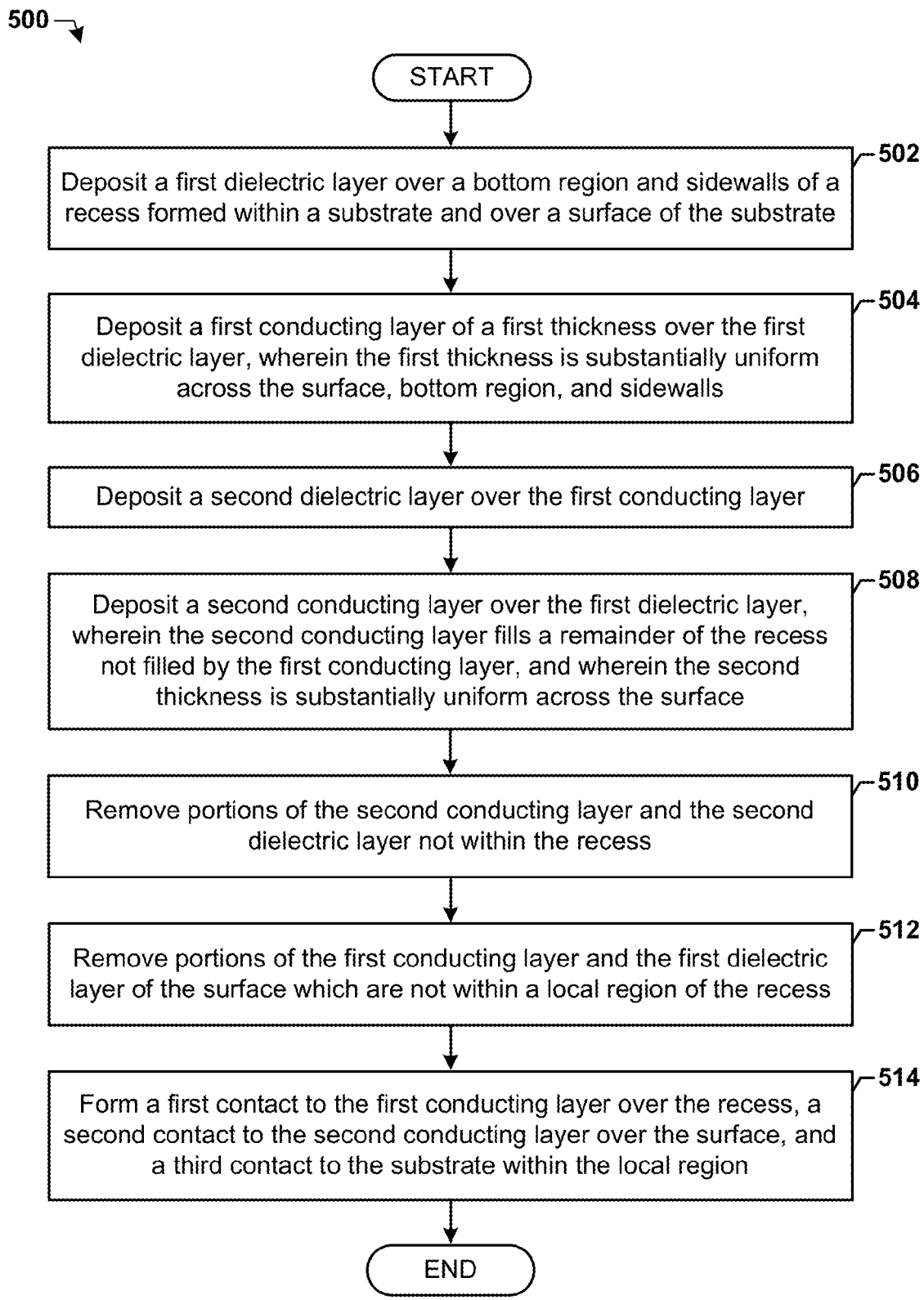
FIG. 5 illustrates some embodiments of a method of forming a double-POLY capacitor structure.

FIG. 5 illustrates some embodiments of a method 500 of forming a double-POLY capacitor structure. While the method 500 and subsequently method 600 are illustrated and described as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 502 a first dielectric layer is deposited over a bottom region and sidewalls of a recess formed within a local region of a substrate and over a surface of the substrate. In some embodiments, the first dielectric layer comprises nitride configured to act as an insulator.

At 504 a first conducting layer of a first thickness is deposited over the first dielectric layer, where the first thickness is substantially uniform across the surface, bottom region, and sidewalls of the substrate. In some embodiments, the first conducting layer comprises polysilicon.

At 506 a second dielectric layer is deposited over the first conducting layer. In some embodiments, the second dielectric layer comprises nitride configured to act as an insulator.

At 508 a second conducting layer is deposited over the first dielectric layer, where the second conducting layer fills a remainder of the recess not filled by the first conducting layer, and where the second thickness is substantially uniform across the surface. In some embodiments, the second conducting layer comprises polysilicon.

At 510 portions of the second conducting layer and the second dielectric layer not within the recess are removed by a CMP process, or an etch back utilized in conjunction with the CMP process.

At 512 portions of the first conducting layer and the first dielectric layer on the surface which are not within a local region of the recess are removed by a pattern and etch process.

At 514 a first contact is formed to the first conducting layer over the surface, a second contact is formed to the second conducting layer over the recess, and a third contact to the substrate within the local region. In some embodiments, the local region comprises an n-type doped region within a vicinity of the capacitor structure.

Figure 6:
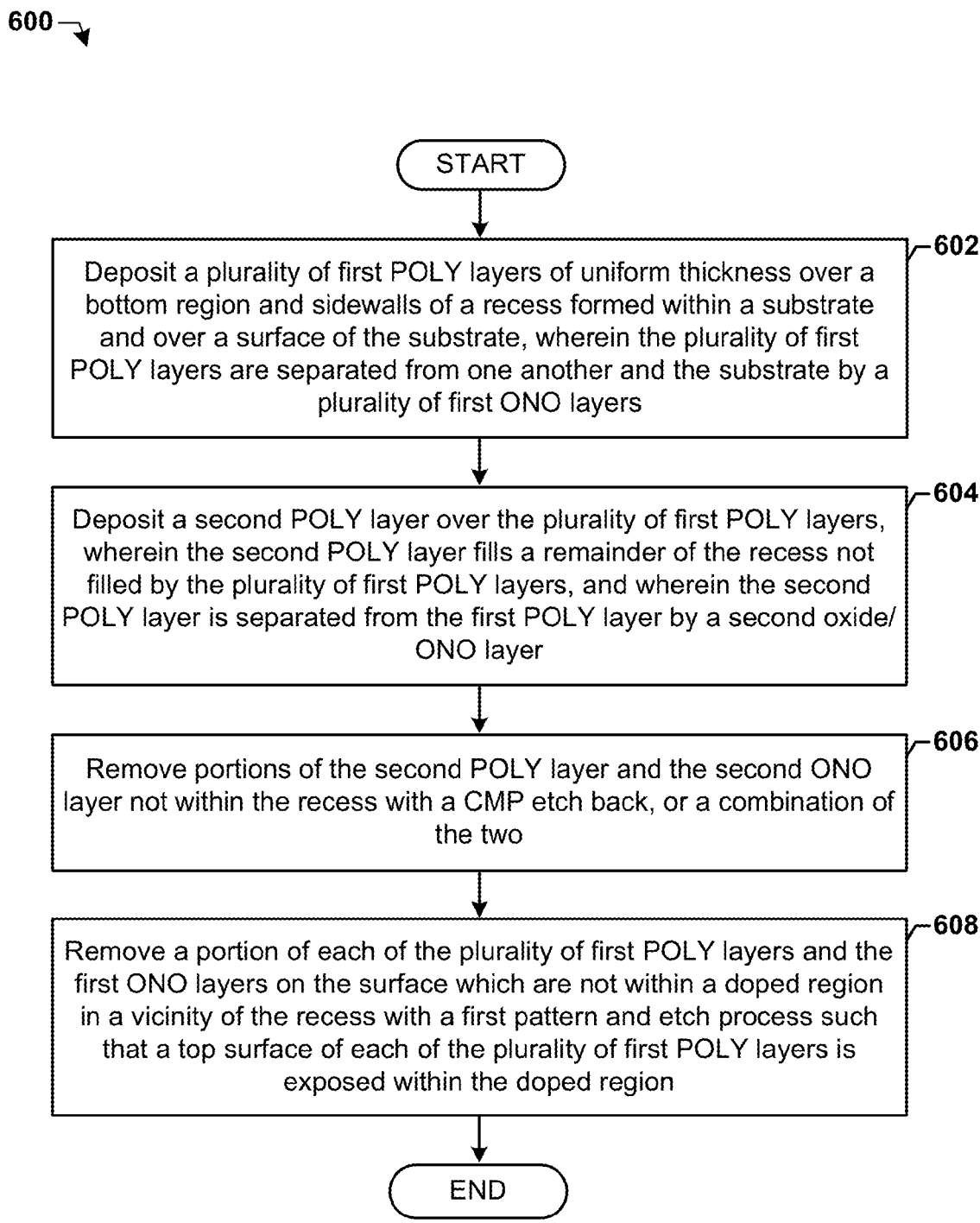
FIG. 6 illustrates some embodiments of a method of forming a multi-POLY capacitor structure.

FIG. 6 illustrates some embodiments of a method 600 of forming a multi-POLY capacitor structure.

At 602 a plurality of first POLY layers of uniform thickness are deposited over a bottom region and sidewalls of a recess formed within a substrate and over a surface of the substrate, wherein the plurality of first POLY layers are separated from one another and the substrate by a plurality of first ONO layers.

At 604 a second POLY layer is deposited over the plurality of first POLY layers, wherein the second POLY layer fills a remainder of the recess not filled by the plurality of first POLY layers, and wherein the second POLY layer is separated from the first POLY layer by a second ONO layer.

At 606 portions of the second POLY layer and the second ONO layer not within the recess are removed with a first CMP, etch back, or a combination of the two.

At 608 a portion of each of the plurality of first POLY layers and the first ONO layers are removed on the surface which are not within a vicinity of the recess with a plurality of first pattern and etch processes such that a top surface of each of the plurality of first polysilicon layers is exposed over the doped region.

Therefore, it will be appreciated that some embodiments of the present disclosure relate to a method of forming a capacitor structure. The method includes depositing a plurality of first POLY layers of uniform thickness over a bottom region and sidewalls of a recess formed within a substrate and over a surface of the substrate. The plurality of first POLY layers are separated from one another and the substrate by a plurality of first ONO layers. The method further includes depositing a second POLY layer over the plurality of first POLY layers. The second POLY layer fills a remainder of the recess not filled by the plurality of first POLY layers, and the second POLY layer is separated from the first POLY layer by a second ONO layer. Portions of the second POLY layer and the second ONO layer not within the recess are removed with a CMP, etch back, or a combination of the two. And, a portion of each of the plurality of first POLY layers and the first ONO layers on the surface which are not within a doped region in a vicinity of the recess are removed with a first pattern and etch process such that a top surface of each of the plurality of first POLY layers is exposed for contact formation.

In some embodiments, a method of forming a capacitor structure is disclosed. The method comprises depositing a first dielectric layer over a bottom region and sidewalls of a recess formed within a substrate and over a surface of the substrate, and depositing a first conducting layer of a first thickness over the first dielectric layer, wherein the first thickness is substantially uniform across the surface, bottom region, and sidewalls. The method further comprises depositing a second dielectric layer over the first conducting layer, and depositing a second conducting layer over the first dielectric layer, wherein the second conducting layer fills a remainder of the recess not filled by the first conducting layer, and wherein the second thickness is substantially uniform across the surface. The method further comprises removing portions of the second conducting layer and the second dielectric layer not within the recess, and removing portions of the first conducting layer and the first dielectric layer on the surface which are not within a local region of the recess. A first contact is formed to the first conducting layer over the surface, a second contact is formed to the second conducting layer over the recess, and a third contact is formed to the substrate within the local region.

In some embodiments, a method of forming a capacitor structure is disclosed. The method comprises depositing a plurality of first polysilicon layers of uniform thickness over a bottom region and sidewalls of a recess formed within a substrate and over a surface of the substrate, wherein the plurality of first polysilicon layers are separated from one another and the substrate by a plurality of first oxide/nitride/oxide layers. The method further comprises depositing a second polysilicon layer over the plurality of first polysilicon layers, wherein the second polysilicon layer fills a remainder of the recess not filled by the plurality of first polysilicon layers, and wherein the second polysilicon layer is separated from the first polysilicon layer by a second oxide/nitride/oxide layer. The method further comprises removing portions of the second polysilicon layer and the second oxide/nitride/oxide layer not within the recess with a first chemical-mechanical polish, etch back, or a combination of the two. The method further comprises removing a portion of each of the plurality of first polysilicon layers and the first oxide/nitride/oxide layers on the surface which are not within a vicinity of the recess with a plurality of first pattern and etch processes such that a top surface of each of the plurality of first polysilicon layers is exposed over the doped region.

In some embodiments, a capacitor structure is disclosed. The capacitor structure comprises a first conducting layer of a first thickness disposed over a bottom region and sidewalls of a recess formed within a substrate and over a surface of the substrate, wherein the first conducting layer is insulated from the substrate by a first dielectric layer, and wherein the first thickness is substantially uniform across the surface, bottom region, and sidewalls. The capacitor structure further comprises a second conducting layer disposed over the first conducting layer and insulated from the first conducting layer by a second dielectric layer, wherein the second conducting layer fills a remainder of the recess not filled by the first conducting layer extends above the substrate by an amount equal to the first thickness. In some embodiments, the capacitor structure further comprises a first contact connected to the first conducting layer over the recess, a second contact to the second conducting layer over the surface of the substrate, and a third contact to the substrate within a local region to the capacitor structure.

Although the disclosure has been shown and described with respect to a certain aspect or various aspects, equivalent alterations and modifications will occur to others of ordinary skill in the art upon reading and understanding this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the disclosure. In addition, while a particular feature of the disclosure may have been disclosed with respect to only one of several aspects of the disclosure, such feature may be combined with one or more other features of the other aspects as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A capacitor structure, comprising:
 a plurality of first conducting layers of uniform thickness disposed over a bottom region and along sidewalls of a recess arranged within a doped region of a substrate and over a surface of the substrate, wherein the plurality of first conducting layers are separated from one another and the substrate by a plurality of first dielectric layers, the plurality of first conducting layers comprising:
  an uppermost first conducting layer having a first planar upper surface and uppermost outer sidewalls spaced apart by a first distance; and
  a lower first conducting layer beneath the uppermost first conducting layer and having outer sidewalls spaced apart by a second distance greater than the first distance and establishing a sidewall step structure with the uppermost first conducting layer;
 a second conducting layer disposed over the plurality of first conducting layers, wherein the second conducting layer fills a remainder of the recess not filled by the plurality of first conducting layers, wherein the second conducting layer is separated from the first conducting layer by a second dielectric layer, wherein the second conducting layer has a second planar upper surface that is coplanar with the first planar upper surface;
 a plurality of first contacts connected to respective upper surfaces of the plurality of first conducting layers, respectively;
 a second contact connected to the second conducting layer over the recess; and
 a third contact connected to the doped region of the substrate.

2. The capacitor structure of claim 1, wherein the plurality of first dielectric layers or the second dielectric layer comprise oxide/nitride/oxide.

3. The capacitor structure of claim 1, wherein the plurality of first conducting layers or the second conducting layer comprise polysilicon.

4. The capacitor structure of claim 1, wherein the substrate comprises a p-type silicon substrate.

5. The capacitor structure of claim 1, wherein the doped region comprises n-type dopants.

6. The capacitor structure of claim 5, wherein the n-type dopants comprise phosphorous, arsenic, or antimony.

7. The capacitor structure of claim 1, wherein the capacitor structure is electronically coupled to an integrated circuit by a wire bond, a through silicon via, or a bond pad.

8. The capacitor structure of claim 1, wherein the capacitor structure resides within a dynamic random-access memory storage cell.

9. A capacitor structure, comprising:
 a lower conducting layer disposed over a bottom region and sidewalls of a recess disposed within a substrate, wherein the lower conducting layer is insulated from the substrate by a lower dielectric layer and has a planar upper surface extending over a surface of the substrate;
 a first conducting layer of a first thickness disposed in the recess over the lower conducting layer, wherein the first conducting layer is insulated from the lower conducting layer by a first dielectric layer, and wherein the first conducting layer has a first planar upper surface establishing a sidewall step structure with the lower conducting layer; and
 a second conducting layer disposed over the first conducting layer and insulated from the first conducting layer by a second dielectric layer, wherein the second conducting layer fills a remainder of the recess not filled by the first conducting layer, and wherein the second conducting layer has a second planar upper surface that is coplanar with the first planar upper surface.

10. The capacitor structure of claim 9, further comprising:
 a first contact connected to the first conducting layer over the surface of the substrate;
 a second contact connected to the second conducting layer over the recess; and
 a third contact connected to a doped region adjacent to the recess in the substrate.

11. The capacitor structure of claim 10, wherein the substrate comprises a p-type silicon substrate, and wherein the doped region comprises an n-type doped region.

12. The capacitor structure of claim 11, wherein a dopant of the n-type doped region comprises phosphorous, arsenic, or antimony.

13. The capacitor structure of claim 9, wherein the first and second conducting layers comprise polysilicon.

14. The capacitor structure of claim 9, wherein the first and second dielectric layers comprise oxide/nitride/oxide.

15. The capacitor structure of claim 9, wherein the capacitor structure is electronically coupled to an integrated circuit by a wire bond, a through silicon via, or a bond pad.

16. A capacitor structure, comprising:
 a recess formed within a surface of a substrate;
 a first dielectric layer disposed over a bottom region of the recess, along sidewalls of the recess, and over the surface of the substrate, wherein the first dielectric layer has a first thickness over the surface of the substrate;
 a first conducting layer disposed along the first dielectric layer, and separated from the substrate by the first dielectric layer, wherein the first conducting layer has a second thickness over the surface of the substrate and wherein the first conducting layer has a first planar upper surface;
 a second dielectric layer disposed along the first conducting layer, and separated from the first dielectric layer by the first conducting layer;
 a second conducting layer disposed along the second dielectric layer within the recess and over the surface of the substrate, wherein the second conducting layer has a second planar upper surface which extends parallel to the surface of the substrate above the first planar upper surface to establish a sidewall step structure with the first conducting layer;
 a third dielectric layer disposed along the second conducting layer, and separated from the second dielectric layer by the second conducting layer; and
 a third conducting layer disposed vertically along the third dielectric layer within the recess, wherein the third conducting layer has a third planar upper surface which is co-planar with the second planar upper surface and which extends parallel to the surface of the substrate.

17. The capacitor structure of claim 16, wherein the second conducting layer has a lower surface that is spaced apart from the surface of the substrate by an amount about equal to a sum of the first thickness and the second thickness.

18. The capacitor structure of claim 17, wherein the sum of the first and second thicknesses is in a range between approximately 1,000 angstroms to approximately 3,000 angstroms.

19. The capacitor structure of claim 16, wherein a sum of a third thickness of the second dielectric layer and a fourth thickness of the second conducting layer is in a range between approximately 9,000 angstroms and approximately 11,000 angstroms.

20. The capacitor structure of claim 16, further comprising:
- a first contact connected to the first conducting layer over the surface of the substrate; and
- a second contact connected to the second conducting layer over the recess.

* * * * *